(12) United States Patent
Fasano et al.

(10) Patent No.: US 6,436,332 B1
(45) Date of Patent: Aug. 20, 2002

(54) LOW LOSS GLASS CERAMIC COMPOSITION WITH MODIFIABLE DIELECTRIC CONSTANT

(75) Inventors: Benjamin V. Fasano, New Windsor; Robert A. Rita, Wappingers Falls, both of NY (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 09/705,139

(22) Filed: Nov. 2, 2000

Related U.S. Application Data

(62) Division of application No. 09/364,844, filed on Jul. 30, 1999, now Pat. No. 6,171,988.

(51) Int. Cl.[7] ............................................. C04B 35/195
(52) U.S. Cl. ........................ 264/619; 264/614; 264/650; 264/670; 264/681; 501/63; 501/66; 501/69; 501/72; 419/19
(58) Field of Search .............................. 501/72, 63, 66, 501/69, 134; 428/210; 264/614, 619, 650, 670, 681; 419/19

(56) References Cited

U.S. PATENT DOCUMENTS

| | | |
|---|---|---|
| 4,854,936 A | 8/1989 | Ono et al. |
| 4,943,470 A | 7/1990 | Shiromizu et al. |
| 4,952,531 A | 8/1990 | Cherukuri |
| 5,006,957 A | 4/1991 | Kumagai et al. |
| 5,185,215 A | 2/1993 | Adams, Jr. et al. |
| 5,326,730 A | 7/1994 | Dumbaugh, Jr. et al. |
| 5,338,598 A | 8/1994 | Ketcham |
| 5,348,915 A | 9/1994 | Thometzek |
| 5,369,062 A | 11/1994 | Chiang et al. |
| 5,400,210 A | 3/1995 | Sugimoto et al. |
| 5,468,694 A | 11/1995 | Taguchi et al. |
| 5,508,235 A | 4/1996 | Marker |
| 5,508,236 A | 4/1996 | Chiang et al. |
| 5,556,585 A * | 9/1996 | Yano et al. |
| 5,574,957 A | 11/1996 | Barnard et al. |
| 5,726,108 A | 3/1998 | Taguchi et al. |
| 5,854,153 A | 12/1998 | Kohli |
| 5,925,443 A | 7/1999 | Aoude et al. |
| 5,998,314 A | 12/1999 | Sugimoto |

OTHER PUBLICATIONS

Abstract of JP 06128028A, Aug. 2000.*
Abstract of JP 407187766, Jul. 1995.*

* cited by examiner

*Primary Examiner*—James Derrington
(74) *Attorney, Agent, or Firm*—John A. Jordan; Ira David Blecker

(57) ABSTRACT

The dielectric constant of low loss tangent glass-ceramic compositions, such as cordierite-based glass ceramics, is modified over a range by selective addition of high dielectric constant ceramics, such as titanates, tantalates and carbides and metals, such as copper. The low loss tangent is retained or improved over a range of frequencies, and the low CTE of the glass-ceramic is maintained. $BaTiO_3$, $SrTiO_3$ and $Ta_2O_5$ produce the most effective results.

8 Claims, No Drawings

LOW LOSS GLASS CERAMIC COMPOSITION WITH MODIFIABLE DIELECTRIC CONSTANT

The present invention is a divisional application related to a U.S. patent application Ser. No. 09/364,844, filed Jul. 30, 1999, now U.S. Pat. No. 6,171,988.

BACKGROUND OF THE INVENTION

1. Field of the Invention

The present invention relates to low loss glass-ceramic materials and methods for preparation of same. More particularly, the present invention relates to compositions and methods for preparation of low CTE glass-ceramic based materials which allow the dielectric constant of the materials to be varied to meet the electrical performance requirements of chip carriers or electronic devices.

2. Background and Related Art

In the fabrication of digital electronic devices, a combination of design factors, such as, metallization line height, width and conductivity and ceramic layer thickness and dielectric constant K, are chosen to maximize both signal transmission speed and metallization and I/O density while at the same time maintaining the desired impedance which is typically that of the various devices and packaging components utilized in assembly of the devices. As digital electronic device applications move into the high frequency marketplace, need will arise for higher dielectric constant ceramic materials that can be used for integrating capacitors within the electronic package, as well as allow metal features to be made smaller for miniaturization of, for example, active filters that can be built into the ceramic. For RF/analog applications, different dielectric constants may be desirable (as well as varied metal line widths/heights) in order to build inductance, capacitance and resonant filter structures that not only have the desired properties, but also take up minimum space to thereby reduce device volume. Often, both digital and analog functions are combined within the same ceramic substrate.

In addition to varying dimensional characteristics in the design of electronic devices, it is also desirable to vary material parameters and, at times, it may also be desirable to vary both dimensional characteristics and material parameters. Typically, varying material parameters involves changes in ceramic composition. Changes in ceramic composition adds cost to manufacturing by requiring multiple raw materials formulations be readily available. In addition, this approach limits the ranges of dielectric constants, for example, to those produced by individual glass, glass-ceramic or ceramic compositions. The range of compositions that may be used is also limited to those having sintering characteristics compatible with those of the electronic package/substrate of which it is a part. Moreover, manufacturing limitations may make it preferable to select from certain ranges of metal line dimensions and ceramic layer thicknesses to produce the highest manufacturing yield and lowest cost.

For the above-described applications and, in particular, high frequency applications it is desirable that the dielectric loss tangent or dissipation factor be kept to a minimum. In addition, it is also desirable to be able to increase the dielectric constant of working glass-ceramic (GC) formulations without significantly affecting electrical resistivity, CTE, fired density or microstructure.

It is known in the art to use molybdenum, tungsten and their oxides as a way to increase the dielectric constant of alumina-based glass bonded ceramics, when these are fired in suitably reducing conditions. However, molybdenum will not survive the steam ambient typically used for binder removal in low temperature glass-ceramic sintering processes. In addition, molybdenum and tungsten cannot be used for air sintering.

U.S. Pat. No. 4,870,539 to Chance et al describes a high dielectric constant, low dielectric loss tangent glass-ceramic material for use in fabricating GBBL capacitors. Chance et al describe making these titanium containing capacitors by crystallizing glass-ceramic compositions formulated to develop cordierite with either $BaTiO_3$ or $SrTiO_3$ in order to form multiphase materials that achieve dielectric constants of approximately 200 to 300 at 10 MHz. These are specially formulated compositions that are completely vitreous or glassy (crystalline free) before the final sintering/densification heat treatment.

SUMMARY OF THE INVENTION

In accordance with the teachings of the present invention, a composition and method of preparation of low CTE glass-ceramic based materials is provided which allow the dielectric constant of the composition to be selectively increased to meet the electrical performance requirements of chip carriers or electronic devices. A cordierite-based glass-ceramic is the preferred starting composition to which additives are combined to selectively increase the dielectric constant. Other glass-ceramic formulations, such as those based upon beta-spodumene, mixtures of glass and ceramic (such as cordierite, mullite, alumina, or the like), or other low CTE materials, may also serve as the main component of the mixture.

The additives are selected so that, in addition to increasing the dielectric constant, they do not significantly impact the low thermal expansion or the sintering shrinkage kinetics of the glass-ceramic, essentially maintain or reduce the loss tangent or dissipation factor of the glass-ceramic and are compatible with existing electronic packaging fabrication requirements and conditions.

Accordingly, it is an object of the present invention to provide an improved glass-ceramic composition and method for making same.

It is another object of the present invention to provide a low loss tangent glass-ceramic composition with modifiable dielectric constant.

It is a further object of the present invention to provide a low loss tangent glass-ceramic with modifiable dielectric constant which exhibits a low CTE.

It is yet a further object of the present invention to provide a low loss tangent glass-ceramic with modifiable dielectric constant which is compatible with low sintering temperature metallizations and which can be fired with such metals in any one of a reducing, oxidizing or neutral atmosphere or all, as required.

The foregoing and other objects, features and advantages of the invention will be apparent from the following more particular description of a preferred embodiment of the invention.

DETAILED DESCRIPTION

In accordance with the present invention, a cordierite-based glass ceramic is the preferred starting composition to which additives are combined to increase the dielectric constant. The additives typically are in the form of powders. These powders are added to powdered glass-ceramic and mixed to a homogenous mixture. Organic components may also be mixed so as to form a tape casting slurry or a screening paste as used to make greensheets or screened layers resident on a carrier or substrate. The amount of additive may be varied to allow for selected changes in the dielectric constant. However, as the additive content increases other properties and characteristics may be degraded, such as sintering kinetics or CTE, thereby limiting the total amount of additive that can be incorporated. Layers having different additive concentrations may be combined within a substrate to form different dielectric constant structures within the same package. This later approach permits designing, for example, inductors, capacitors and high speed transmission paths in the same package. Other additives, such as, ceramics, glasses, glass-ceramics or metals and semiconductors, may also be incorporated to improve or adjust other properties as well. For example, these latter may be used to adjust strength, CTE or sintering kinetics.

Using a cordierite glass-ceramic as the base composition, a number of combinations of glass-ceramic and additives were prepared. The cordierite glass-ceramic base material used is made of the following composition:

| Oxide | Weight % |
|---|---|
| $SiO_2$ | 55 |
| $Al_2O_3$ | 21 |
| MgO | 22 |
| $P_2O_5$ | 0.3 |
| $B_2O_3$ | 1.3 |

This composition, when fired in a controlled ambient (i.e. not air) has a low dielectric constant (5.0–5.2) and a low loss tangent or dissipation factor (0.0005 or less). In addition, its CTE matches that of silicon.

In accordance with the present invention, additives for dielectric constant enhancement include high K ceramics such as titanates, tantalates, carbides, tungstates, niobates or metals and semiconductors. While the specific additives used in these examples are limited to $BaTiO_3$, $SrTiO_3$, $Ta_2O_5$, $TiO_2$, etc., it will be understood that more complex formulations based upon mixtures of these, or modifications frequently employed in the capacitor industry, would apply equally well. These modification& include substituting (in whole or in part) other alkaline earth oxides such as Mg and Ca for Sr and Ba in the titanate compounds and substituting Zr, W, Nb, and Ta for Ti in the titanates, as desired and appropriate. Where oxidizable metals, such as those based upon Cu or Ni are used as conductive substrate metallizations, sintering may be restricted to occur only in reducing or essentially neutral atmospheres (low $pO_2$ or oxygen partial pressure). In addition Ag, Au, Pd, Pt, or alloys or mixtures of these, may also be used with sintering in air, steam or other oxidizing or reducing conditions.

For the results shown in Tables I and II below, mixing the powder was performed by hand in a mortar and pestle. Powder particle sizes typically averaged about 1–3 microns for the ceramic and metal powders. However, other sizes may be preferred, depending upon the application. The blended powders were then pressed into disks. Both the type and amount of additive were varied and the parts were fired, without metallization, in both air and steam (very low $O_2$ partial pressure) atmospheres at temperatures between 850° C. and 1000° C. After firing, the disks were physically measured to determine the sintering shrinkage from the unfired state. The disks were then metallized on both top and bottom surfaces with silver paint and electrical measurements were made with a Hewlett Packard (HP) Model 4275A Multi-Frequency LCR meter to measure loss tangents (loss tan) and dielectric constants at frequencies of 20 KHz, 100 KHz and 1 MHz. A Hewlett Packard Model 4329A High DC Resistance meter was used to measure resistivity.

Table I shows the results for air firing of the base glass-ceramic and mixtures containing $BaTiO_3$, $SrTiO_3$, $TiO_2$, $Ta_2O_5$, SiC, Ti/N, Ti/C and $TiB_2$ additives at 5 and 10 volume percent substitution for the base cordierite GC.

TABLE I

HIGH-K GLASS-CERAMIC + ADDITIVE FORMULATIONS AIR CYCLE

| Material | % Shrinkage (diameter) | Resistivity (ohm-cm) | 20 KHz K | 20 KHz loss tan | 100 KHZ K | 100 KHz loss tan | 1 MHz K | 1 MHz loss tan |
|---|---|---|---|---|---|---|---|---|
| Cordierite GC | −20.10 | 1.4E+016 | 5.2 | 0.003 | 5.2 | 0.003 | 5.1 | 0.003 |
| 5% $BaTiO_3$ | −20.10 | 3.3E+014 | 5.7 | 0.004 | 5.6 | 0.004 | 5.7 | 0.003 |
| 10% $BaTiO_3$ | −18.66 | 3.2E+014 | 6.2 | 0.001 | 6.2 | 0.008 | 6.2 | 0.000 |
| 15% $BaTiO_3$ | −14.58 | 7.2E+014 | 6.5 | 0.002 | 6.5 | 0.001 | 6.5 | 0.001 |
| 10% $SrTiO_3$ | −20.06 | 5.3E+014 | 6.8 | 0.004 | 6.8 | 0.003 | 6.8 | 0.002 |
| 15% $SrTiO_3$ | −17.55 | 6.5E+013 | 7.2 | 0.001 | 7.2 | 0.001 | 7.2 | 0.001 |
| 10% $TiO_2$ | −12.11 | 4.0E+014 | 5.3 | 0.002 | 5.3 | 0.002 | 5.2 | 0.001 |
| 15% $TiO_2$ | −14.41 | 5.3E+014 | 6.0 | 0.002 | 5.9 | 0.002 | 5.9 | 0.001 |
| 5% $Ta_2O_5$ | −18.26 | 0.0E+000 | 0.0 | 0.002 | 3.6 | 0.002 | 3.6 | 0.003 |
| 10% $Ta_2O_5$ | −18.22 | 0.0E+000 | 0.0 | 0.003 | 3.8 | 0.002 | 3.8 | 0.001 |
| 5% SiC | −20.24 | 1.6E+014 | 6.8 | 0.004 | 6.8 | 0.004 | 6.8 | 0.003 |
| 10% SiC | −19.75 | 3.7E+014 | 8.7 | 0.007 | 8.7 | 0.006 | 8.6 | 0.007 |
| 5% TiN | −14.80 | 2.7E+014 | 5.4 | 0.002 | 5.3 | 0.002 | 5.3 | 0.001 |
| 10% TiN | −5.30 | 1.3E+016 | 3.9 | 0.002 | 3.9 | 0.002 | 3.9 | 0.001 |
| 5% TiC | −10.66 | 2.6E+015 | 5.3 | 0.002 | 5.3 | 0.002 | 5.2 | 0.002 |
| 10% TiC | −2.23 | 4.6E+015 | 2.7 | 0.059 | 2.5 | 0.036 | 2.5 | 0.006 |
| 5% $TiB_2$ | −17.06 | 0.0E+000 | 0.0 | 0.026 | 0.1 | 0.011 | 0.1 | −0.004 |
| 10% $TiB_2$ | −12.38 | 3.0E+013 | 8.7 | 0.022 | 8.5 | 0.027 | 8.1 | 0.035 |

The first entry of Table I, identified as the cordierite glass-ceramic is the control, unadulterated glass-ceramic composition given above. Air sintering of glass-ceramic substrates has the advantage of using simpler and lower cost sintering furnaces and processes than steam sintering. An air sintering process typically uses silver, silver-palladium or gold. Entries with resistivities at or near zero result from the silver paint shorting between electrodes, due to sintering cracks or high porosity in the fired mixtures.

Table II shows the results for steam firing using the same additives as Table I and includes Cu metal as well.

Accordingly, additions of certain high dielectric constant ceramics, such as titanates, tantalates (niobates, tungstates, etc.) or semiconductors, such as SiC, or metals, such as Cu, Ni, Ag, Au, Pd, Pt and alloys thereof, to cordierite or other

TABLE II

HIGH-K GLASS-CERAMIC + ADDITIVE FORMULATIONS STEAM CYCLE

| Material | % Shrinkage (diameter) | Resistivity (ohm-cm) | 20 KHz K | 20 KHz loss tan | 100 KHZ K | 100 KHz loss tan | 1 MHz K | 1 MHz loss tan |
|---|---|---|---|---|---|---|---|---|
| Cordierite GC | −21.48 | 8.7E+013 | 5.1 | 0.001 | 5.0 | 0.001 | 5.0 | 0.001 |
| 5% $BaTiO_3$ | −21.34 | 1.5E+014 | 6.0 | 0.002 | 6.0 | 0.002 | 6.0 | 0.002 |
| 10% $BaTiO_3$ | −18.88 | 1.3E+014 | 6.1 | 0.007 | 6.1 | 0.003 | 6.1 | 0.001 |
| 15% $BaTiO_3$ | −15.80 | 1.1E+014 | 6.1 | 0.004 | 6.0 | 0.005 | 6.0 | 0.006 |
| 10% $SrTiO_3$ | −20.66 | 4.3E+014 | 6.6 | 0.012 | 6.6 | 0.012 | 6.4 | 0.011 |
| 15% $SrTiO_3$ | −18.08 | 8.4E+013 | 6.4 | 0.001 | 6.4 | 0.001 | 6.4 | 0.000 |
| 10% $TiO_2$ | −13.63 | 3.3E+013 | 4.9 | 0.006 | 4.9 | 0.003 | 4.9 | 0.002 |
| 15% $TiO_2$ | −11.00 | 5.4E+013 | 5.1 | 0.005 | 5.1 | 0.003 | 5.1 | 0.002 |
| 5% $Ta_2O_5$ | −17.95 | 1.6E+015 | 5.1 | 0.002 | 5.1 | 0.002 | 5.1 | 0.003 |
| 10% $Ta_2O_5$ | −20.64 | 3.1E+014 | 6.2 | 0.003 | 6.2 | 0.002 | 6.2 | 0.001 |
| 5% SiC | −21.28 | 1.2E+015 | 6.6 | 0.004 | 6.5 | 0.003 | 6.5 | 0.004 |
| 10% SiC | −20.59 | 2.5E+015 | 8.2 | 0.006 | 8.2 | 0.005 | 8.1 | 0.006 |
| 5% TiN | −20.25 | 3.0E+013 | 7.8 | 0.010 | 7.7 | 0.011 | 7.6 | 0.016 |
| 10% TiN | −18.24 | 1.0E+010 | 10.7 | 0.081 | 10.0 | 0.065 | 9.2 | 0.051 |
| 5% TiC | −13.34 | 5.9E+014 | 4.4 | 0.032 | 4.2 | 0.017 | 4.2 | 0.007 |
| 10% TiC | −4.57 | 2.8E+014 | 4.1 | 0.059 | 3.9 | 0.036 | 3.8 | 0.006 |
| 5% $TiB_2$ | −16.66 | 7.7E+014 | 0.1 | 0.026 | 0.1 | 0.011 | 0.1 | −0.004 |
| 10% $TiB_2$ | −12.66 | 4.3E+014 | 4.7 | 0.003 | 4.7 | 0.002 | 4.7 | 0.001 |
| 5% Cu | −20.94 | 1.6E+015 | 6.0 | 0.006 | 5.9 | 0.008 | 5.9 | 0.017 |
| 10% Cu | −21.03 | 3.8E+015 | 7.9 | 0.001 | 7.9 | 0.001 | 7.9 | 0.002 |

It can be seen that most of the additives generally had minimal impact on shrinkage in both air and steam firing indicating they did not significantly inhibit densification and, thus, should provide a hermetic and strong fired ceramic. However, the nitride, carbide and boride of titanium additives interfere to some extent with sintering and result in somewhat porous fired ceramics, particularly at concentrations higher than 5%. As can be seen from the Tables I and II, these additives also result in a relatively lower dielectric constant and relatively higher loss tangents, especially when fired in steam. The $TiO_2$ additives also behave somewhat like this group.

low CTE glass-ceramics, can produce raised dielectric constant, high relative density and low loss tangent substrate materials when combined in appropriate amounts and sintered in a standard electronic device fabrication sintering cycle.

In Table III, the results for a more limited set of additives are provided.

TABLE III

HIGH-K GLASS-CERAMIC + ADDITIVE FORMULATIONS STEAM CYCLE

| Sample | Composition | K 100 KHz | loss tan 100 KHz | K 1 MHz | loss tan 1 MHz | K 4 MHz | loss tan 4 MHz |
|---|---|---|---|---|---|---|---|
| Cordierite GC | no additive | 5.43 | 0.0010 | 5.43 | 0.0007 | 5.43 | 0.0015 |
| A | GC + 10% $SrTiO_3$ | 7.36 | 0.0018 | 7.35 | 0.0005 | 7.33 | 0.0004 |
| $A_2$ | GC + 10% $SrTiO_3$ | 7.36 | 0.0018 | 7.35 | 0.0005 | 7.33 | 0.0004 |
| B | GC + 10% $Ta_2O_5$ | 6.27 | 0.0022 | 6.26 | 0.0005 | 6.25 | 0.0003 |
| C | GC + 10% SiC | 7.82 | 0.0053 | 7.77 | 0.0041 | 7.73 | 0.0047 |
| D | GC + 8% Cu | 8.49 | 0.0009 | 8.48 | 0.0007 | 8.48 | 0.0030 |

As can also be seen from Tables I and II, SiC and Cu additives tend to result in mixtures with (high relative densities) low porosities and relatively higher dielectric constants. In addition, the Cu plus glass-ceramic mixtures tend to have low loss tangents while the SiC plus glass-ceramic mixtures can have somewhat increased loss tangents.

The $BaTiO_3$, $SrTiO_3$ and $Ta_2O_5$ additives provided the best results. These additives give high relative density and low porosity, increased dielectric constant and very low loss tangent.

These compositions were prepared by combining the powders together in a ball mill with organic solvents and binders, and then tape casting the resulting slurries into green sheets. The resulting greensheets were then laminated into disks after circular copper paste electrodes were screened onto outside surfaces of the top and bottom layers. One electrode was screened to form a concentric guard-ring configuration. The disks were then fired in steam to remove the organic binders and then in slightly reducing atmospheres at about 960° C. to obtain dense parts. The fired samples were electrically characterized using the same technique described earlier. Measurements were made here over a broader frequency range, i.e., up to 4 MHz, and the results show little change in dielectric constant and some improvement in loss tangent as frequency increases. All formulations considered here appeared to sinter compatibly with the Cu metallization. This method of sample preparation closely approximates conventional multilayer ceramic manufacturing processes and will generally produce less porous and more uniform parts than hand processing techniques.

The results disclosed here show that selective additives to glass-ceramic formulations can increase the dielectric constant by at least 20% without significantly affecting the fired thermal expansion or sintering shrinkage kinetics of the glass-ceramic. In addition, the loss tangent or dissipation factor of the glass-ceramic is either maintained or reduced. Fabrication of these modified glass-ceramic dielectrics is compatible with low temperature metallization sintering requirements for Ag, Au, Cu, Ni and the like and alloys based upon these metals. They can be fired with one or more metals in either reducing, oxidizing or neutral atmospheres (or all) as required and can be co-sintered with unmodified glass-ceramic. The additive-modified glass-ceramic formulations also maintain compatibility with conventional thick-film processing techniques, such as tape casting, personalization, metallization, and the like, such that metallized multilayer structures may be prepared and sintered to dense, and preferably hermetic, substrates for chip carrier and other electronic device applications.

It will be understood from the foregoing description that various modifications and changes may be made in the preferred embodiment of the present invention without departing from its true spirit. It is intended that this description is for purposes of illustration only and should not be construed in a limiting sense. The scope of this invention should be limited only by the language of the following claims.

What is claimed is:

1. A method of selectively increasing the dielectric constant of glass-ceramic comprising:

adding to a cordierite-based powdered glass-ceramic between 5–15% by volume of powdered high dielectric constant additive material selected from among $BaTiO_3$, $SrTiO_3$, $Ta_2O_5$, SiC and Cu;

mixing said glass-ceramic powder and high dielectric constant additive material powder to a homogenous mixture;

forming parts from said homogenous mixture; and firing said parts at temperatures between 850° C. and 1000° C.

2. The method as set forth in claim 1 wherein said homogenous mixture is combined with organic solvents and binders to form a slurry and said parts are formed by casting said slurry into greensheets before firing.

3. The method as set forth in claim 2 wherein greensheets with different concentrations of additive material are combined before firing to form different dielectric constant structures within the same electronic package.

4. The method as set forth in claim 2 wherein metal paste is screened on said greensheet before firing so that the greensheet and metal paste are cofired.

5. The method as set forth in claim 3 wherein metal paste is screened on at least one of said greensheets before said greensheets with different concentrations are combined for firing so that said greensheets and metal paste are cofired.

6. A method of selectively increasing the dielectric constant of glass-ceramic and maintaining low loss tangents over a range of frequencies, comprising:

adding about 5–15 by volume percent of powdered high dielectric additive material selected from among $BaTiO_3$, $SrTiO_3$ and $Ta_2O_5$ to a cordierite-based powered glass-ceramic material;

mixing said powdered additive material with said powdered glass-ceramic material to a homogenous mixture;

forming parts from said homogenous mixture;

firing said parts at temperatures between approximately 850° C. and 1000° C.

7. The method as set forth in claim 6 wherein said cordierite-based glass-ceramic material comprises approximately 55 weight percent $SiO_2$, 21 weight percent $Al_2O_3$, 22 weight percent MgO, 0.03 weight percent $P_2O_5$ and 1.3 weight percent $B_2O_3$.

8. A method of selectively increasing the dielectric constant of glass-ceramic and maintaining low loss tangents over a range of frequencies, comprising:

adding about 5–15 by volume percent of powdered high dielectric additive material selected from among $BaTiO_3$, $SrTiO_3$, $Ta_2O_5$, SiC and Cu to a cordierite-based powdered glass-ceramic material;

mixing said powdered additive material with said powdered glass-ceramic material to a homogenous mixture;

forming parts from said homogenous mixture; and firing said parts at temperatures between approximately 850° C. and 1000° C.

* * * * *